United States Patent
Choi et al.

(10) Patent No.: US 9,128,511 B2
(45) Date of Patent: Sep. 8, 2015

(54) SEMICONDUCTOR DEVICE AND OPERATION METHOD THEREOF

(71) Applicant: SK hynix Inc., Gyeonggi-do (KR)

(72) Inventors: Hae-Rang Choi, Gyeonggi-do (KR); Yong-Ju Kim, Gyeonggi-do (KR); Dae-Han Kwon, Gyeonggi-do (KR); Jae-Min Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/709,991

(22) Filed: Dec. 10, 2012

(65) Prior Publication Data

US 2014/0068112 A1    Mar. 6, 2014

(30) Foreign Application Priority Data

Aug. 29, 2012    (KR) .................. 10-2012-0095049

(51) Int. Cl.
*G06F 3/00* (2006.01)
*G11C 7/22* (2006.01)
*G11C 7/10* (2006.01)
*G11C 11/4076* (2006.01)
*G11C 11/4093* (2006.01)
*G11C 11/4096* (2006.01)

(52) U.S. Cl.
CPC *G06F 3/00* (2013.01); *G11C 7/109* (2013.01); *G11C 7/1012* (2013.01); *G11C 7/1066* (2013.01); *G11C 7/1093* (2013.01); *G11C 7/22* (2013.01); *G11C 11/4076* (2013.01); *G11C 11/4093* (2013.01); *G11C 11/4096* (2013.01)

(58) Field of Classification Search
None
See application file for complete search history.

(56) References Cited

U.S. PATENT DOCUMENTS 6,121,815 A * 9/2000 Terada et al. .................. 327/292

FOREIGN PATENT DOCUMENTS

KR    1019960039328    1/1996

* cited by examiner

*Primary Examiner* — Idriss N Alrobaye
*Assistant Examiner* — Richard B Franklin
(74) *Attorney, Agent, or Firm* — IP & T Group LLP

(57) ABSTRACT

A semiconductor device includes a characteristic code storage unit configured to store signal transfer characteristic information input through a given pad and output a control code corresponding to the signal transfer characteristic information, and a characteristic reflection unit configured to reflect the signal transfer characteristic information in an input signal input through the given pad, in response to the control code, and to output the reflected input signal.

8 Claims, 3 Drawing Sheets

SEMICONDUCTOR DEVICE AND OPERATION METHOD THEREOF

CROSS-REFERENCE TO RELATED APPLICATIONS

The present application claims priority of Korean Patent Application No. 10-2012-0095049, filed on Aug. 29, 2012, which is incorporated herein by reference in its entirety.

BACKGROUND

1. Field

Exemplary embodiments of the present invention relate to a semiconductor design technology, and more particularly, to a semiconductor device that controls skews of a plurality of input signals.

2. Description of the Related Art

In general, a semiconductor memory device such as a double data rate synchronous DRAM (DDR SDRAM) receives a plurality of signals such as commands, addresses, or data from an exterior, and performs a write operation or a read operation. In the write operation, the semiconductor memory device receives addresses and data and stores the data in a memory cell corresponding to the addresses. Furthermore, in the read operation, the semiconductor memory device outputs the data stored in the memory cell corresponding to the addresses to an exterior.

Meanwhile, recently, since a semiconductor memory device shows an improvement toward a high speed and large capacity, the amount of data to be processed at a time is gradually increased. The increase in the amount of data capable of being processed is indebted to not only high operating frequency but a parallel data interface. That is, when a large amount of data is input or output through a plurality of data pads at a time, it is possible to perform an operation of processing a larger amount of data.

FIG. 1 is a block diagram illustrating a partial configuration of a conventional semiconductor memory device.

Referring to FIG. 1, the conventional semiconductor memory device includes first to $n^{th}$ delay units 111_1 to 111_$n$, a data storage unit 112, and a skew control unit 113. The semiconductor memory device receives data DQ1 to DQn, a plurality of addresses ADD, and a plurality of commands CMD through corresponding pads, and performs a write operation or a read operation.

The first to $n^{th}$ delay units 111_1 to 111_$n$ reflect times, which correspond to first to $n^{th}$ delay control codes CTR1<1:m> to CTRn<1:m>, in the data DQ1 to DQn input through a plurality of data pads, and output data to the data storage unit 112. The data storage unit 112 receives and stores the data DQ1 to DQn in the write operation, and outputs the stored data to the first to $n^{th}$ delay units 111_1 to 111_$n$ in the read operation. The skew control unit 113 generates the first to $n^{th}$ delay control codes CTR1<1:m> to CTRn<1:m> based on the addresses ADD and the commands CMD.

The first to $n^{th}$ delay units 111_1 to 111_$n$ compensate for skews to be reflected in the data DQ1 to DQn in response to the first to $n^{th}$ delay control codes CTR1<1:m> to CTRn<1:m>.

In more detail, even though the data DQ1 to DQn input from an exterior is input to corresponding data pads at substantially the same time point, different skews due to different signal transfer paths are reflected in the data DQ1 to DQn. Therefore, the data DQ1 to DQn are transferred to the data storage unit 112 at different time points, and circuits for compensating for the skews are the first to $n^{th}$ delay units 111_1 to 111_$n$. That is, the first to $n^{th}$ delay units 111_1 to 111_$n$ set delay amounts according to the first to $n^{th}$ delay control codes CTR1<1:m> to CTRn<1:m>, and the data DQ1 to DQn is delayed by corresponding delay amounts and is transferred to the data storage unit 112. Through such a delay compensating operation, the data DQ1 to DQn may be transferred to the data storage unit 112 at substantially the same time point.

As described above, the first to $n^{th}$ delay units 111_1 to 111_$n$ determine delay amounts based on the first to $n^{th}$ delay control codes CTR1<1:m> to CTRn<1:m>, and the skew control unit 113 generates the first to $n^{th}$ delay control codes CTR1<1:m> to CTRn<1:m> in response to a plurality of addresses ADD and a plurality of commands CMD input in a test operation mode.

Meanwhile, as a semiconductor memory device shows a tendency toward a high speed and large capacity, the number of the data DQ1 to DQn is gradually increased, and thus the number of delay units corresponding to the data DQ1 to DQn is also increased. Therefore, the number of the first to $n^{th}$ delay control codes CTR1<1:m> to CTRn<1:m> for controlling the first to $n^{th}$ delay units 111_1 to 111_$n$ is also increased. An increase in the number of the first to $n^{th}$ delay control codes CTR1<1:m> to CTRn<1:m> leads to an increase in the number of transfer lines for transferring the delay control codes, resulting in a burden in a layout design.

Furthermore, in order to finely control times of the first to $n^{th}$ delay units 111_1 to 111_$n$, the bit number of the first to $n^{th}$ delay control codes CTR1<1:m> to CTRn 1:m> needs to be larger than m. The first to $n^{th}$ delay control codes CTR1 1:m> to CTRn<1:m> are transferred through relatively long signal lines. That is, when the bit number of the delay control codes is increased, the number of the long signal lines is also increased, resulting in a burden in the layout design.

SUMMARY

Exemplary embodiments of the present invention are directed to a semiconductor device that controls signal transfer characteristics of data input through substantially the same input terminal according to a control signal input through the input terminal.

In accordance with an embodiment of the present invention, a semiconductor device includes a characteristic code storage unit configured to store signal transfer characteristic information input through a given pad and output a control code corresponding to the signal transfer characteristic information, and a characteristic reflection unit configured to reflect the signal transfer characteristic information in an input signal input through the given pad, in response to the control code, and to output the reflected input signal.

In accordance with another embodiment of the present invention, a semiconductor memory device includes a plurality of data input/output pads, and a plurality of characteristic control units, each corresponding to the plurality of data input/output pads, configured to store signal transfer characteristic information input through the corresponding data input/output pads in a code storage operation mode, and to reflect the signal transfer characteristic information in data input through the corresponding data input/output pads in a write operation mode.

In accordance with yet another embodiment of the present invention, a method for operating a semiconductor memory device having a plurality of data input/output pads includes storing a plurality of signal transfer characteristics information corresponding to the plurality of pads, the plurality of signal transfer characteristics information each input through_ the corresponding pads, in a code storage operation mode, receiving a plurality of write data through the corresponding pads in a write operation mode, and reflecting the corresponding signal transfer characteristics information in the corresponding write data, and transferring the reflected write data to a storage circuit.

The semiconductor device according to the embodiment of the present invention receives data and a control signal through substantially the same input terminal, thereby controlling signal transfer characteristics of the data using the control signal.

The configuration of a circuit for controlling signal transfer characteristics of data may be minimized, resulting in a reduction of an area of the semiconductor device.

DETAILED DESCRIPTION

Figure 1:
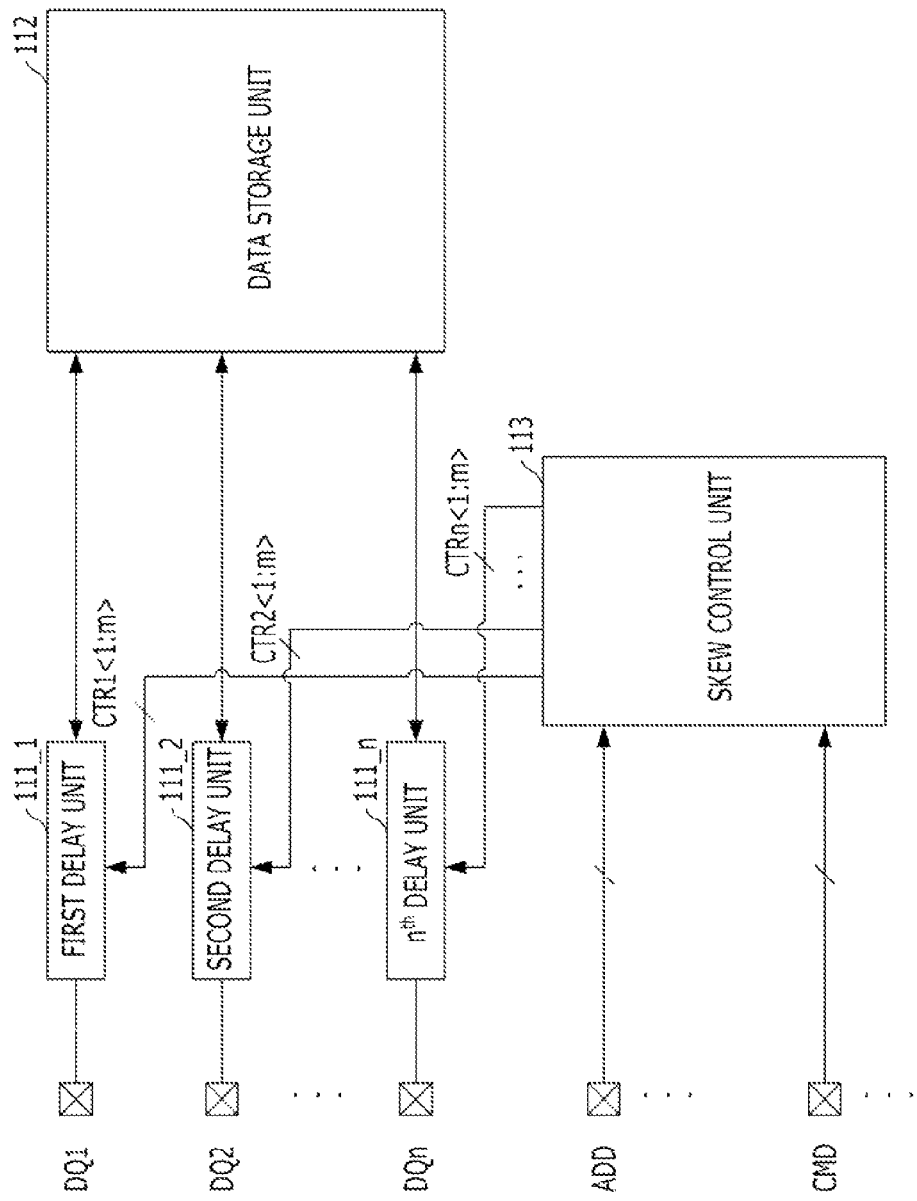
FIG. 1 is a block diagram illustrating a partial configuration of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
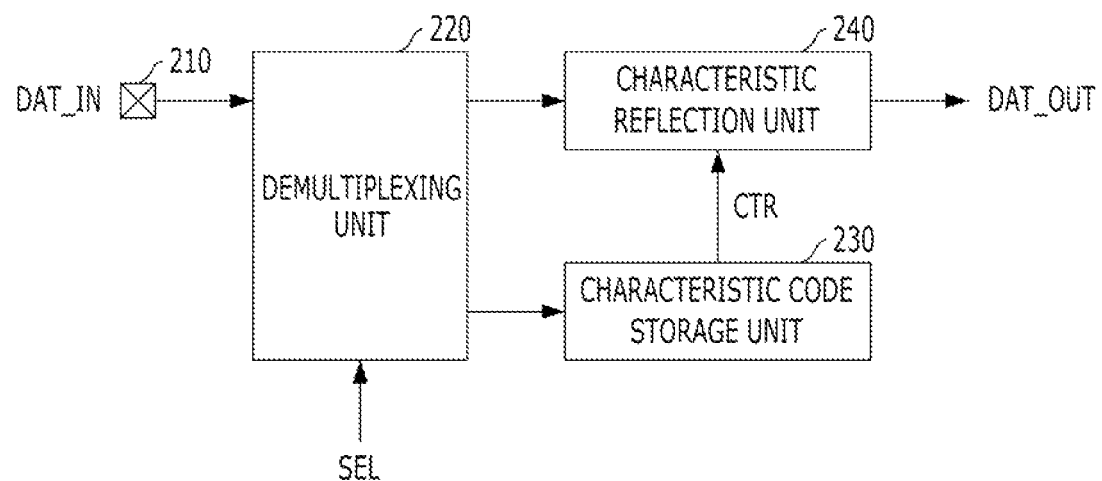
FIG. 2 is a block diagram illustrating a partial configuration of a semiconductor device in accordance with an embodiment of the present invention.

FIG. 2 is a block diagram illustrating a partial configuration of a semiconductor device in accordance with an embodiment of the present invention.

Referring to FIG. 2, the semiconductor device includes an input pad 210, a demultiplexing unit 220, a characteristic code storage unit 230, and a characteristic code reflection unit 240.

The demultipiexing unit 220 is configured to selectively transfer a signal (DAT_IN hereinafter, referred to as an 'input signal'), which is input through the input pad 210, to the characteristic code storage unit 230 or the characteristic reflection unit 240 according to a code storage operation mode or a normal operation mode. In detail, the demultiplexing unit 220 selectively transfers the input signal DAT_IN in response to a mode selection signal SEL which denotes the normal operation mode and the code storage operation mode, and the input signal DAT_IN is transferred to the characteristic code storage unit 230 in the code storage operation mode, and is transferred to the characteristic reflection unit 240 in the normal operation mode.

In the code storage operation mode, signal transfer characteristics to be reflected in the input signal DAT_IN in the normal operation mode are stored in the characteristic code storage unit 230. That is, the input signal DAT_IN in the normal operation mode may be a general signal, and the input signal DAT_IN in the code storage operation mode becomes an information code corresponding to the signal transfer characteristics. For example, the information code may include delay information of a signal and skew information of a signal.

The characteristic code storage unit 230 is configured to store the input signal DAT_IN in the code storage operation mode, to store the information code input through the input signal DAT_IN in the code storage operation mode, and to output the stored information code as a control code CTR in the normal operation mode.

The characteristic reflection unit 240 is configured to be controlled by the control code CTR, and to reflect the information code, which is stored in the characteristic code storage unit 230, in the input signal DAT_IN. That is, an output signal DAT_OUT is obtained by reflecting signal transfer characteristic information corresponding to the control code CTR in the input signal DAT_IN. For example, when the control code CTR has signal transfer characteristic information on delay amount of a signal, the output signal DAT_OUT is obtained by reflecting a delay time corresponding to the control code CTR in the input signal DAT_IN.

In the code storage operation mode, signal transfer characteristic information is input to the input signal DAT_IN, and is stored in the characteristic code storage unit 230 through the demultiplexing unit 220. In the normal operation mode, a normal signal is input as the input signal DAT_IN, and the characteristic reflection unit 240 reflects signal transfer characteristic information corresponding to the control code CTR in the input signal, and outputs the signal.

It is possible for the semiconductor device in accordance with the embodiment of the present invention to receive an arbitrary input signal and an information code corresponding to signal transfer characteristics of the arbitrary input signal through one input pad 210, and to control signal transfer characteristics of the arbitrary input signal in response to the control code CTR corresponding to the signal transfer characteristic information.

Figure 3:
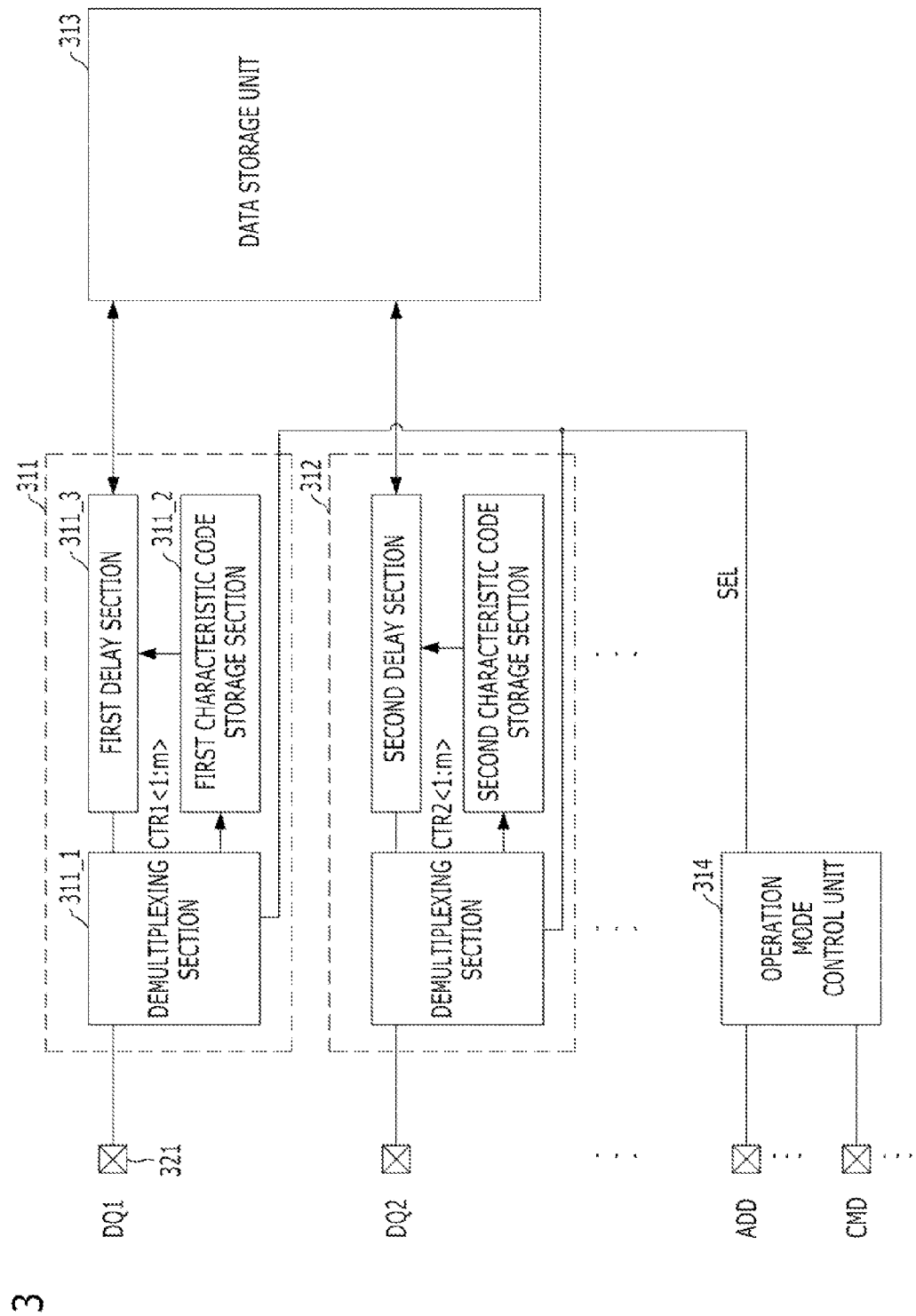
FIG. 3 is a block diagram illustrating a partial configuration of a semiconductor memory device in accordance with another embodiment of the present invention.

FIG. 3 is a block diagram illustrating a partial configuration of a semiconductor memory device in accordance with another embodiment of the present invention. FIG. 3 illustrates an example of a configuration for controlling delay amount of signal transfer characteristics. It is possible to control various signal transfer characteristics through various design changes.

Referring to FIG. 3, a semiconductor memory device 310 includes a plurality of characteristic control units including a first characteristic control units 311, a second characteristic control units 312, a data storage unit 313, and an operation mode control unit 314.

The plurality of characteristic control units are configured to correspond to a plurality of input/output pads. Hereinafter for the purpose of convenience, the first characteristic control unit 311 of the plurality of characteristic control units will be representatively described. The first characteristic control unit 311 is configured to correspond to a first data input/output pad 321, to store an information code, corresponding to signal transfer characteristics, input through the first data input/output pad 321, to reflect the stored information code in data DQ1 which is input/output through the first data input/output pad 321. The first characteristic control unit 311 includes a first demultiplexing section 311_1, a first characteristic code storage section 311_2, and a first delay section 311_3, and the operation of each element will be described as follows.

The first demultiplexing section 311_1 is configured to selectively connect the first data input/output pad 321 to the first characteristic code storage section 311_2 or the first delay section 311_3 in response to an operation mode selection signal SEL. The operation mode selection signal SEL is used to distinguish a code storage operation mode from a normal operation mode, and the first demultiplexing section 311_1 connects the first data input/output pad 321 to the first characteristic code storage section 311_2 in the code storage operation mode and connects the first data input/output pad 321 to the first delay section 311_3 in the normal operation mode based on the operation mode selection signal SEL.

The first characteristic code storage section 311_2 is configured to store first data DQ1 in the code storage operation mode, wherein the first data DQ1 stored in the first characteristic code storage section 311_2 is output as first control code CTR1<1:m> in the normal operation mode. The first characteristic code storage section 311_2 stores the information code. The present embodiment employs an example of storing information code on a delay amount of the first delay section 311_3.

The first delay section 311_3 is configured to reflect signal transfer characteristic information, which corresponds to the first control code CTR1<1:m>, in a signal which is input/output through the first data input/output pad 321 in the normal operation mode, wherein the first data DQ1 is output after being delayed by times corresponding to the first control code CTR1<1:m> and is transferred to the data storage unit 313. Such an operation of the first delay section 311_3 represents a write operation of the normal operation mode, and in a read operation of the normal operation mode, the first delay section 311_3 receives the data stored in the data storage unit 313, delays the data by the times corresponding to the first control code CTR1<1:m> and transfers the delayed data to the first demultiplexing section 311_1, which will be described again when a circuit operation of the semiconductor memory device is described.

The data storage unit 313 is configured to store the data output through the first characteristic control unit 311 in the write operation of the normal operation mode, or to output the stored data to the first characteristic control unit 311 in the read operation of the normal operation mode.

The operation mode control unit 314 is configured to control the operation mode of the first characteristic control unit 311, to generate the operation mode selection signal SEL, and to selectively control the code storage operation mode and the normal operation mode of the first characteristic control unit 311. The present embodiment employs an example in which the operation mode selection signal SEL is generated by a plurality of addresses ADD and a plurality of commands CMD. However, as apparent from FIG. 3, the operation mode selection signal SEL is used to selectively control the code storage operation mode or the normal operation mode. Accordingly, in order to control the plurality of characteristic control units (including 311 and 312), only one signal line is required, and in order to generate one operation mode selection signal SEL, only one address or one command corresponding to the one operation mode selection signal SEL needs to be input.

The semiconductor memory device in accordance with the embodiment of the present invention distinguishes the code storage operation mode from the normal operation mode based on the operation mode selection signal SEL. Particularly, each of the plurality of demultiplexing sections receives only the operation mode selection signal SEL and controls a corresponding operation mode. According to such a structure, a burden in a layout design may be reduced, as compared with the conventional art.

Hereinafter, an operation of the simple circuit of FIG. 3 will be described.

In the code storage operation mode, the first data DQ1 is received through the first data input/output pad 321. At this time, the first data DQ1 has signal transfer characteristic information, wherein signal transfer characteristic information (hereinafter, referred to as 'write signal transfer characteristic information') corresponding to the write operation of the normal operation mode and signal transfer characteristic information (hereinafter, referred to as 'read signal transfer characteristic information') corresponding to the read operation of the normal operation mode may be different from each other. In this case, the data storage unit 313 may store both the write signal transfer characteristic information and the read signal transfer characteristic information through the code storage operation mode. Next, the first demultiplexing section 311_1 transfers the first data DQ1 to the first characteristic code storage section 311_2, and the first characteristic code storage section 311_2 outputs the first data DQ1 as the first control code CTR1<1:m>.

Then, in the write operation of the normal operation mode, the first data DQ1 is received through the first data input/output pad 321. At this time, the first data DQ1 is to be stored in the data storage unit 313. The first demultiplexing section 311_1 transfers the first data DQ1 to the first delay section 311_3, and the first delay section 311_3 delays the first data DQ1 by a time corresponding to the first control code CTR1<1:m> and outputs the delayed data. The data storage unit 313 stores the output data. That is, the write signal transfer characteristic information is reflected in the first data DQ1 transferred to the data storage unit 313.

Then, in the read operation of the normal operation mode after the code storage operation mode, the data stored in the data storage unit 313 is transferred to the first delay section 311_3, and the first delay section 311_3 delays the data by the time corresponding to the first control code CTR1<1:m> and outputs the delayed data. At this time, the first demultiplexing section 311_1 outputs an output signal of the first delay section 311_3 to an exterior through the first data input/output pad 321. That is, the read signal transfer characteristic information is reflected in the data output to the first data input/output pad 321.

It may be possible for the semiconductor memory device in accordance with the embodiment of the present invention to control signal transfer characteristics of input/output data in the read operation and the write operation. Particularly, input/output data to be controlled and signal transfer characteristics corresponding to the input/output data are received through substantially the same input/output pad, resulting in the minimization of a circuit for the code storage operation mode and the normal operation mode.

While the present invention has been described with respect to the specific embodiments, it will be apparent to those skilled in the art that various changes and modifications may be made without departing from the spirit and scope of the invention as defined in the following claims.

Moreover, the positions and types of the logic gates and transistors in the aforementioned embodiment may be changed according to the polarity of an input signal.

What is claimed is:

1. A semiconductor device comprising:
    a characteristic code storage unit configured to store signal transfer characteristic information specified in an input signal input through a given pad during a code storage operation mode, and output a control code corresponding to the signal transfer characteristic information during a normal operation mode;
    a characteristic reflection unit configured to reflect the signal transfer characteristic information in an input signal input through the given pad, in response to the control code, and to output the reflected input signal; and a demultiplexing unit configured to directly transfer the input signal to the characteristic code storage unit during the code storage operation mode or the characteristic reflection unit during the normal operation mode in response to a mode selection signal, wherein the input signal includes a data signal during the normal operation mode, and the input signal specifies the signal transfer characteristic information during the code storage operation mode.

2. The semiconductor device of claim 1, wherein the characteristic code storage unit is configured to store the input signal transferred from the demultiplexing unit as the signal transfer characteristic information in a code storage operation mode.

3. The semiconductor device of claim 2, further comprising:

an operation mode control unit configured to select the operation mode.

4. The semiconductor device of claim 1, wherein the characteristic reflection unit is configured to reflect the signal transfer characteristic information corresponding to the control code in a signal output from an interior, and to output the signal to the given pad.

5. A semiconductor memory device comprising:

a plurality of data input/output pads; and a plurality of characteristic control units, each corresponding to the plurality of data input/output pads, configured to store signal transfer characteristic information specified in an input signal input through the corresponding data input/output pads in a code storage operation mode, and to reflect the signal transfer characteristic information in the input signal input through the corresponding data input/output pads in a write operation mode, wherein each of the characteristic control units comprises:

a demultiplexing section configured to directly connect the corresponding data input/output pad to a characteristic code storage section for the code storage operation mode or to a characteristic reflection section for the write operation mode in response to an operation mode selection signal; and an operation mode control unit configured to generate and output the operation mode selection signal to the demultiplexing section, and to control the demultiplexing section, wherein the input signal includes the data signal during the write operation mode, and the input signal specifies the signal transfer characteristic information having delay information and skew information during the code storage operation mode.

6. The semiconductor memory device of claim 5, wherein the characteristic code storage section is configured to store the signal transfer characteristic information input through a corresponding pad in the code storage operation mode, and output a control code corresponding to the signal transfer characteristic information, and the characteristic reflection section is configured to reflect the signal transfer characteristic information in the data input through the corresponding data input/output pad, in response to the control code, and to output the reflected signal, in the write operation mode.

7. The semiconductor memory device of claim 5, wherein further comprising:

a data storage unit configured to store the data output through the characteristic control units in the write operation mode, or to output the stored data to the characteristic control units in a read operation mode.

8. The semiconductor memory device of claim 5, wherein the characteristic reflection section is configured to reflect a delay amount corresponding to the control code in the data input through the corresponding input/output pad.

* * * * *

UNITED STATES PATENT AND TRADEMARK OFFICE
CERTIFICATE OF CORRECTION

| | | |
|---|---|---|
| PATENT NO. | : 9,128,511 B2 | Page 1 of 1 |
| APPLICATION NO. | : 13/709991 | |
| DATED | : September 8, 2015 | |
| INVENTOR(S) | : Hae-Rang Choi et al. | |

It is certified that error appears in the above-identified patent and that said Letters Patent is hereby corrected as shown below:

Title Page

Change Item (56) the References Cited section Delete: "1/1996" and insert --11/1996-- as follows:

FOREIGN PATENT DOCUMENTS

KR　　　　1019960039328　　　　11/1996

Signed and Sealed this
Nineteenth Day of January, 2016

Michelle K. Lee
*Director of the United States Patent and Trademark Office*